(12) United States Patent
Komposch et al.

(10) Patent No.: US 9,293,407 B2
(45) Date of Patent: *Mar. 22, 2016

(54) SEMICONDUCTOR PACKAGE HAVING A BASEPLATE WITH A DIE ATTACH REGION AND A PERIPHERAL REGION

(71) Applicant: Infineon Technologies AG, Neubiberg (DE)

(72) Inventors: Alexander Komposch, Morgan Hill, CA (US); Soon Ing Chew, Milpitas, CA (US); Brian Condie, Gilroy, CA (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/531,186

(22) Filed: Nov. 3, 2014

(65) Prior Publication Data

US 2015/0048492 A1    Feb. 19, 2015

Related U.S. Application Data

(63) Continuation of application No. 13/432,333, filed on Mar. 28, 2012, now Pat. No. 8,907,467.

(51) Int. Cl.
*H01L 23/34* (2006.01)
*H01L 21/00* (2006.01)
(Continued)

(52) U.S. Cl.
CPC .... *H01L 23/49844* (2013.01); *H01L 21/76898* (2013.01); *H01L 23/047* (2013.01); *H01L 23/06* (2013.01); *H01L 23/10* (2013.01); *H01L 23/13* (2013.01); *H01L 23/142* (2013.01); *H01L 23/481* (2013.01); *H01L 23/49827* (2013.01); *H01L 23/5226* (2013.01); *H01L 24/83* (2013.01); *H01L 24/29* (2013.01); *H01L 24/32* (2013.01); *H01L 24/48* (2013.01); *H01L 24/49* (2013.01); *H01L 24/73* (2013.01); *H01L 24/85* (2013.01); *H01L 25/0657* (2013.01); *H01L 2224/2919* (2013.01); *H01L 2224/29144* (2013.01); *H01L 2224/32245* (2013.01); *H01L 2224/48195* (2013.01);
(Continued)

(58) Field of Classification Search
CPC . H01L 23/36; H01L 25/0657; H01L 23/5226; H01L 23/49844; H01L 23/481; H01L 23/142; H01L 24/83; H01L 23/345
See application file for complete search history.

(56) References Cited

U.S. PATENT DOCUMENTS 8,907,467 B2 *  12/2014  Komposch et al. ........... 257/692

FOREIGN PATENT DOCUMENTS

CN    101553918 A    10/2009

*Primary Examiner* — Alonzo Chambliss
(74) *Attorney, Agent, or Firm* — Murphy, Bilak & Homiller, PLLC (57) ABSTRACT

A semiconductor package includes a baseplate having a die attach region and a peripheral region, a transistor die having a first terminal and a second terminal facing away from the baseplate, and a frame including an electrically insulative member having a first side attached to the peripheral region of the baseplate, a second side facing away from the baseplate, a first metallization at the first side of the insulative member and a second metallization at the second side of the insulative member. The insulative member extends outward beyond a lateral sidewall of the baseplate. The first metallization is attached to the part of the first side which extends outward beyond the lateral sidewall of the baseplate. The first and second metallizations are electrically connected at a region of the insulative member spaced apart from the lateral sidewall of the baseplate.

20 Claims, 12 Drawing Sheets

(51) Int. Cl.
  *H01L 23/498* (2006.01)
  *H01L 23/522* (2006.01)
  *H01L 23/047* (2006.01)
  *H01L 23/10* (2006.01)
  *H01L 23/13* (2006.01)
  *H01L 21/768* (2006.01)
  *H01L 23/48* (2006.01)
  *H01L 23/06* (2006.01)
  *H01L 23/14* (2006.01)
  *H01L 25/065* (2006.01)
  *H01L 23/00* (2006.01)

(52) U.S. Cl.
  CPC ............... *H01L 2224/48227* (2013.01); *H01L 2224/49109* (2013.01); *H01L 2224/73265* (2013.01); *H01L 2224/8385* (2013.01); *H01L 2224/83447* (2013.01); *H01L 2224/83801* (2013.01); *H01L 2224/83805* (2013.01); *H01L 2224/85447* (2013.01); *H01L 2924/01028* (2013.01); *H01L 2924/01029* (2013.01); *H01L 2924/01046* (2013.01); *H01L 2924/01079* (2013.01); *H01L 2924/01322* (2013.01); *H01L 2924/1033* (2013.01); *H01L 2924/10272* (2013.01); *H01L 2924/10329* (2013.01); *H01L 2924/1304* (2013.01); *H01L 2924/1305* (2013.01); *H01L 2924/1306* (2013.01); *H01L 2924/13055* (2013.01); *H01L 2924/13091* (2013.01); *H01L 2924/1421* (2013.01); *H01L 2924/1531* (2013.01); *H01L 2924/16251* (2013.01); *H01L 2924/16787* (2013.01); *H01L 2924/19041* (2013.01); *H01L 2924/19105* (2013.01)

SEMICONDUCTOR PACKAGE HAVING A BASEPLATE WITH A DIE ATTACH REGION AND A PERIPHERAL REGION

FIELD OF TECHNOLOGY

The present application relates to RF-power packages, in particular window frames for RF-power packages.

BACKGROUND

Air cavity packages for RF power applications include an RF power transistor die with the source terminal attached to a metal flange and a ceramic (alumina) based window frame for isolating the gate and drain leads of the power transistor from the source-connected flange. Such packages are relatively expensive and have poor CTE (coefficient of thermal expansion) matching. Standard RF power packages are often built with either CPC (copper, copper-molybdenum, copper laminate flange), CuW or CuMo flanges all having a CTE closely matched to ceramic. However, the CTE of the flange tends to be quite lower than the system cooling blocks/coins which are soldered onto the flange. CTE mismatch between the flange and the cooling blocks/coins creates solder fatigue, component fracture and bowing issues. Also, there is a CTE match with the leads so that the window frame and corresponding leads are CTE matched with the customer PCB (printed circuit board).

In addition, conventional RF power packages have gate and drain leads attached to and protruding outward from the ceramic window frame. The leads provide input and output terminals to the package. However, the leads typically comprise Alloy42, Kovar, copper or similar materials and are typically 3-7 mil thick. Such leads are soft and readily bend in the region unsupported by the window frame, creating a problem with the seating plane height for soldering. In addition, conventional metal/ceramic packages transmit RF energy through high loss Ni/Pd/Au or Ni/Au plating due to the skin effect in RF. Another approach is a plastic/molded LCP (liquid crystal polymer) window frame in place of a ceramic window frame. However, LCP window frame type packages have an inherent gross leak issue which results in decreased reliability and higher yield loss. A more reliable, lower cost air cavity RF power package is therefore desirable.

SUMMARY

According to an embodiment of a semiconductor package, the package comprises a copper-containing baseplate having a die attach region and a peripheral region, and a transistor die. The transistor die has a first terminal attached to the die attach region of the baseplate, and a second terminal and a third terminal facing away from the baseplate. The package further comprises a frame including an electrically insulative member having a first side attached to the peripheral region of the baseplate, a second side facing away from the baseplate, a first copper-containing metallization at the first side of the insulative member and a second copper-containing metallization at the second side of the insulative member. The insulative member extends outward beyond a lateral sidewall of the baseplate. The first metallization is attached to the part of the first side which extends outward beyond the lateral sidewall of the baseplate. The first and second metallizations are electrically connected at a region of the insulative member spaced apart from the lateral sidewall of the baseplate.

According to another embodiment of a semiconductor package, the package comprises an electrically conductive baseplate having an inner region and a peripheral region and a transistor die. The transistor die has a first terminal attached to the inner region of the baseplate, and a second terminal and a third terminal facing away from the baseplate. The package further comprises an electrically insulative member having a thinner region attached to the peripheral region of the baseplate, a thicker region extending outward beyond a lateral sidewall of the baseplate so that the insulative member overhangs the baseplate, and an opening in the thinner region which receives the transistor die. A first metallization at a first side of the insulative member facing away from the base plate is electrically connected to the second terminal of the transistor die. A second metallization at the first side of the insulative member and spaced apart from the first metallization is electrically connected to the third terminal of the transistor die. A third metallization attached to the thicker region of the insulative member at a second opposing side of the insulative member is electrically connected to the first metallization at a region of the insulative member spaced apart from the lateral sidewall of the baseplate.

According to yet another embodiment of a semiconductor package, the package comprises a baseplate, an RF power transistor die having a first side attached to the baseplate and a second side facing away from the baseplate and a printed circuit board (PCB) window frame. The PCB window frame comprises a electrically insulative member attached to the baseplate with the die positioned in an opening of the electrically insulative member and the electrically insulative member extending outward beyond a lateral sidewall of the baseplate, a first metallization embedded in or laminated on a side of the electrically insulative member facing away from the baseplate and electrically connected to the transistor die at the second side of the transistor die, and a second metallization embedded in or laminated on the part of the electrically insulative member which extends outward beyond the lateral sidewall of the baseplate at a side of the electrically insulative member facing away from the first metallization. The second metallization is insulated from the baseplate and electrically connected to the first metallization at an edge region of the electrically insulative member distant to the baseplate.

According to an embodiment of a method of manufacturing a semiconductor package, the method comprises: providing a copper-containing baseplate having a die attach region and a peripheral region, and a frame comprising an electrically insulative member having a first side, a second opposing side, a first copper-containing metallization at the first side and a second copper-containing metallization at the second side; attaching a first terminal of a transistor die to the die attach region of the baseplate; attaching the first side of the insulative member to the peripheral region of the baseplate so that the second side faces away from the baseplate, the insulative member extends outward beyond a lateral sidewall of the baseplate and the first metallization is spaced apart from the lateral sidewall of the baseplate; electrically connecting a second terminal of the transistor die which faces away from the baseplate to the second metallization; and electrically connecting the first and second metallizations at a region of the insulative member spaced apart from the lateral sidewall of the baseplate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described next are embodiments of a PCB (printed circuit board) based power semiconductor package. The package has a metal baseplate and a PCB-based window frame. The source side of an RF-power transistor die is connected to the baseplate. The PCB-based window frame isolates the source from the gate and drain which are disposed at the opposite side of the die as the source. The package can be enclosed with an optional ceramic, LCP or PCB based lid so that the package is an open-cavity package. In each case, the PCB-based window frame is more cost effective, provides better CTE matching with the baseplate and enables high flexibility in lead configurations for both straight lead and surface mount configurations. For example, a copper baseplate and a PCB-based window frame with copper traces have very closely matched CTEs. The PCB-based window frame is also rigid and therefore more stable and not susceptible to bending. In addition, the PCB-based package has improved RF transmission characteristics compared to existing metal/ceramic packages in that the RF signal energy can be transmitted through routing/microstrips/traces of highly conductive copper on the PCB dielectric.

Figure 1A:
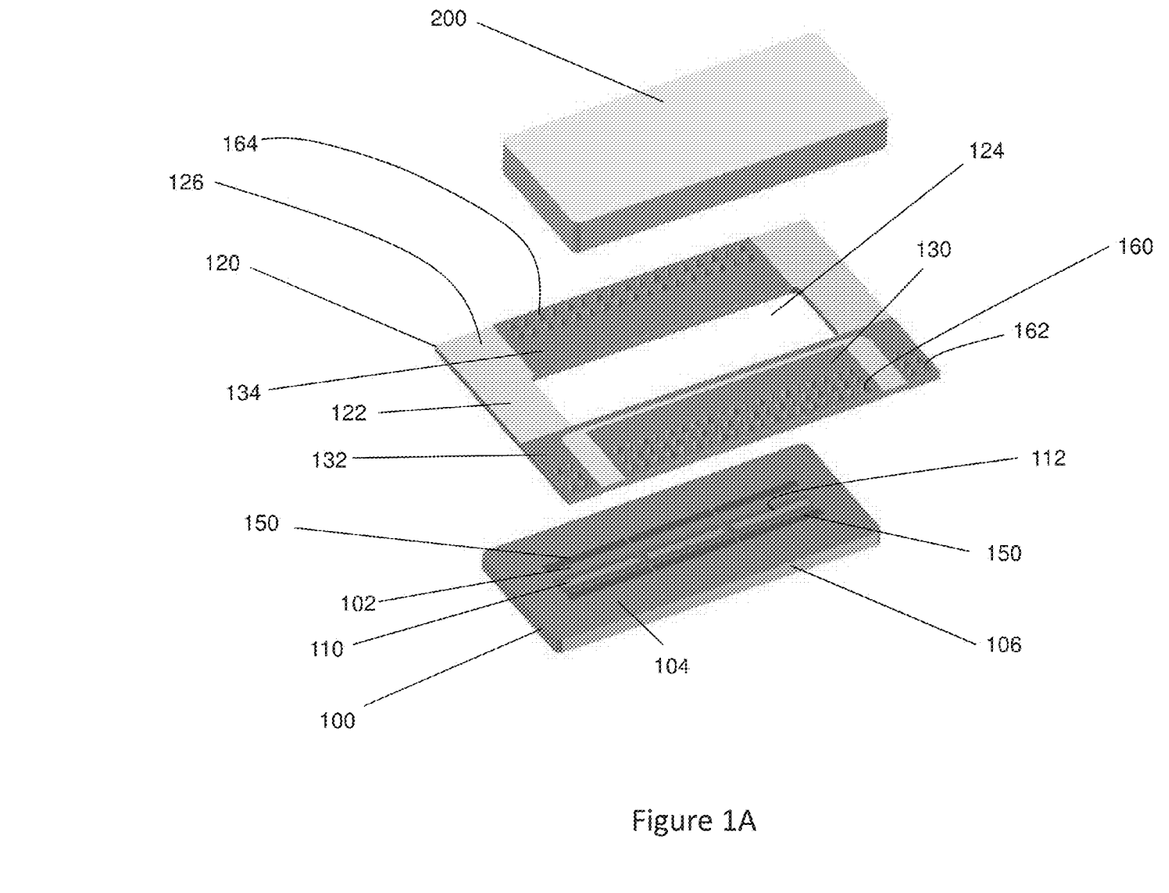
FIGS. 1A and 1B illustrate different exploded views of an embodiment of a PCB-based power semiconductor package having a straight lead configuration.
Figure 1B:
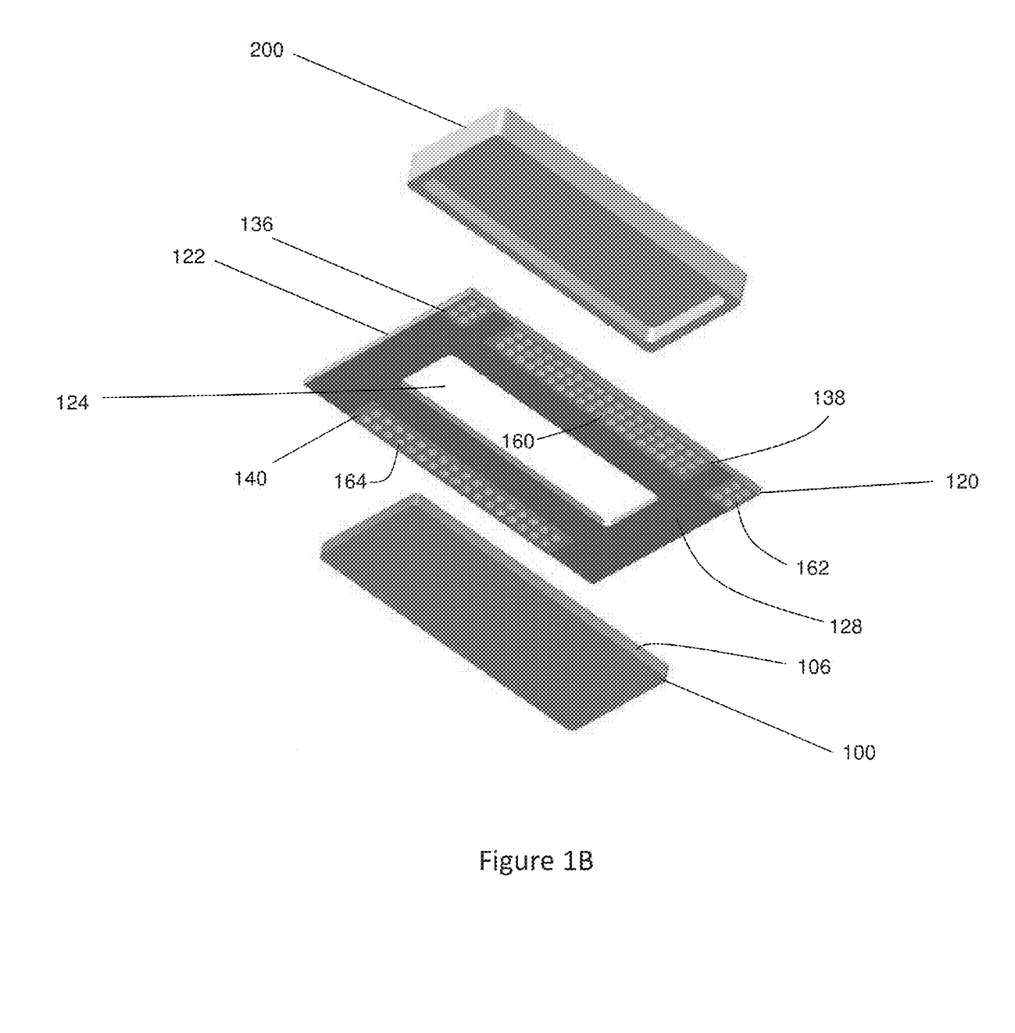

FIG. 1A illustrates a top-down exploded view of the semiconductor package with a straight lead configuration, and FIG. 1B illustrates a bottom-up exploded view of the same package. The package includes a baseplate 100, one or more transistor die 110 such as an RF power transistor die e.g. a power MOSFET (metal oxide semiconductor field effect transistor) such as an LDMOS (laterally diffused metal oxide semiconductor) attached source-side down to the baseplate 100, a PCB window frame 120, and an optional ceramic, LCP or PCB based lid 200. The baseplate 100 is made of an electrically conductive material such as Cu, CPC (copper, copper-molybendum, copper laminate structure) or CuW, and has a CTE which closely matches that of the PCB-based window frame 120. The source side of the die 110 is attached to an inner die attach region 102 of the baseplate 100 e.g. using soft solder, eutectic die attach material such as AuSi or AuSn, or using an organic adhesive. In each case, the source side of the transistor die 110 is electrically connected to the baseplate 100. The PCB window frame 120 includes conductive pathways, tracks or signal traces etched from copper sheets laminated, embedded or otherwise attached to an electrically insulative member 122 which is attached to an outer peripheral region 104 of the baseplate 100. The insulative member 122 of the PCB window frame 120 has an opening 124 for receiving the transistor die 110 and any other components 150 attached to the inner die attach region 102 of the baseplate 100, e.g. such as input and output match capacitors, DC blocking capacitors, IPDs (integrated passive devices), etc. The insulative member 122 extends outward beyond a lateral sidewall 106 of the baseplate 100 to provide support for upper and lower metallizations embedded in or laminated to opposing sides 126, 128 of the insulative member 122.

In more detail, a first metallization 130 is embedded in or laminated to a top side 126 of the insulative member 122 facing away from the baseplate 100 and is electrically connected to the transistor die 110 at a top side 112 of the die 110 facing away from the baseplate 100. The drain and gate terminals of the transistor 110 are provided at this side 112 of the die 110. In one embodiment, the first metallization 130 forms an output terminal of the package which is electrically connected to the drain terminal of the transistor die 110. The top side 126 of the insulative member 122 may have a second metallization 132 spaced apart from the first metallization 130, which provides DC bias to the drain terminal of the transistor die 110. The second metallization 132 forms a type of DC bus bar according to this embodiment. A third metallization 134 also disposed at the top side 126 of the insulative member 122 is spaced apart from the first and second metallizations 130, 132. The third metallization 134 forms an input terminal of the package which is electrically connected to the gate terminal of the transistor die 110. Electrical connections to the die 110 are not shown in FIGS. 1A and 1B for ease of illustration, but can be provided e.g. using bond wires as is known in the art.

As shown in FIG. 1A, the input terminal can be provided at one (input or gate) side of the package and the DC bus bar and the output terminal can be provided at the opposite (output or drain) side of the package. Other types of transistors can be used, e.g. such as IGBTs (insulated gate bipolar transistors) which have a collector instead of a drain and an emitter instead of a source. Accordingly, the source connection described above corresponds to the emitter of the IGBT and the drain connections described above correspond to the collector of the IGBT. The IGBT also has a gate terminal connected as described above. SiC, GaN and GaAs based devices can also be used.

The insulative member 122 of the PCB window frame 120 has a bottom side 128 which is attached to the peripheral region 104 of the baseplate 100. Additional (lower) metallizations are provided at the bottom side 128 of the insulative member 122 as shown in FIG. 1B, which illustrates a bottom-up exploded view of the semiconductor package. Each one of the lower metallizations corresponds to one of the metallizations disposed at the top side 126 of the insulative member 122. For example, a first lower metallization 136 corresponds to the DC bus bar metallization 132 on the top side 126, a second lower metallization 138 corresponds to the output terminal metallization 130 on the top side 126, and a third lower metallization 140 corresponds to the input terminal metallization 134 on the top side 126. Each of the additional (lower) metallizations 136, 138, 140 are embedded, laminated or otherwise attached to a bottom part of the insulative member 122 which extends outward beyond the lateral sidewall 106 of the baseplate 100. As such, the lower metallizations 136, 138, 140 are insulated from the baseplate 100. In the case of an electrically insulative member insulative member 122, each metallization 130, 132, 134, 136, 138, 140 is embedded in or laminated on either the top side 126 or bottom side 128 of the electrically insulative member 122.

Corresponding ones of the upper and lower metallizations are electrically connected to each other in a region of the insulative member 122 spaced away from the baseplate 100. For example, the first lower metallization 136 on the bottom side 128 of the insulative member 122 is electrically connected to the DC bus bar metallization 132 on the top side 126 of the insulative member 122 at an edge region of the insulative member 122 distant to the baseplate 100. In the embodiment illustrated in FIGS. 1A and 1B, the insulative member 122 has electrically conductive vias 160, 162, 164 extending between the top and bottom sides 126, 128 of the insulative member 122 for electrically connecting the corresponding upper and lower metallizations 130/138, 132/136, 134/140 at a region of the insulative member 122 spaced apart from the lateral sidewall 106 of the baseplate 110. This way, the PCB-based window frame 120 ensures the gate and drain terminals of the transistor die 110 are isolated from the source side of the die 110 which is attached to the baseplate 100. In one embodiment, the vias 160, 162, 164 comprise openings extending through the insulative member 122 and having sidewalls covered by a copper-containing material.

Figure 2A:
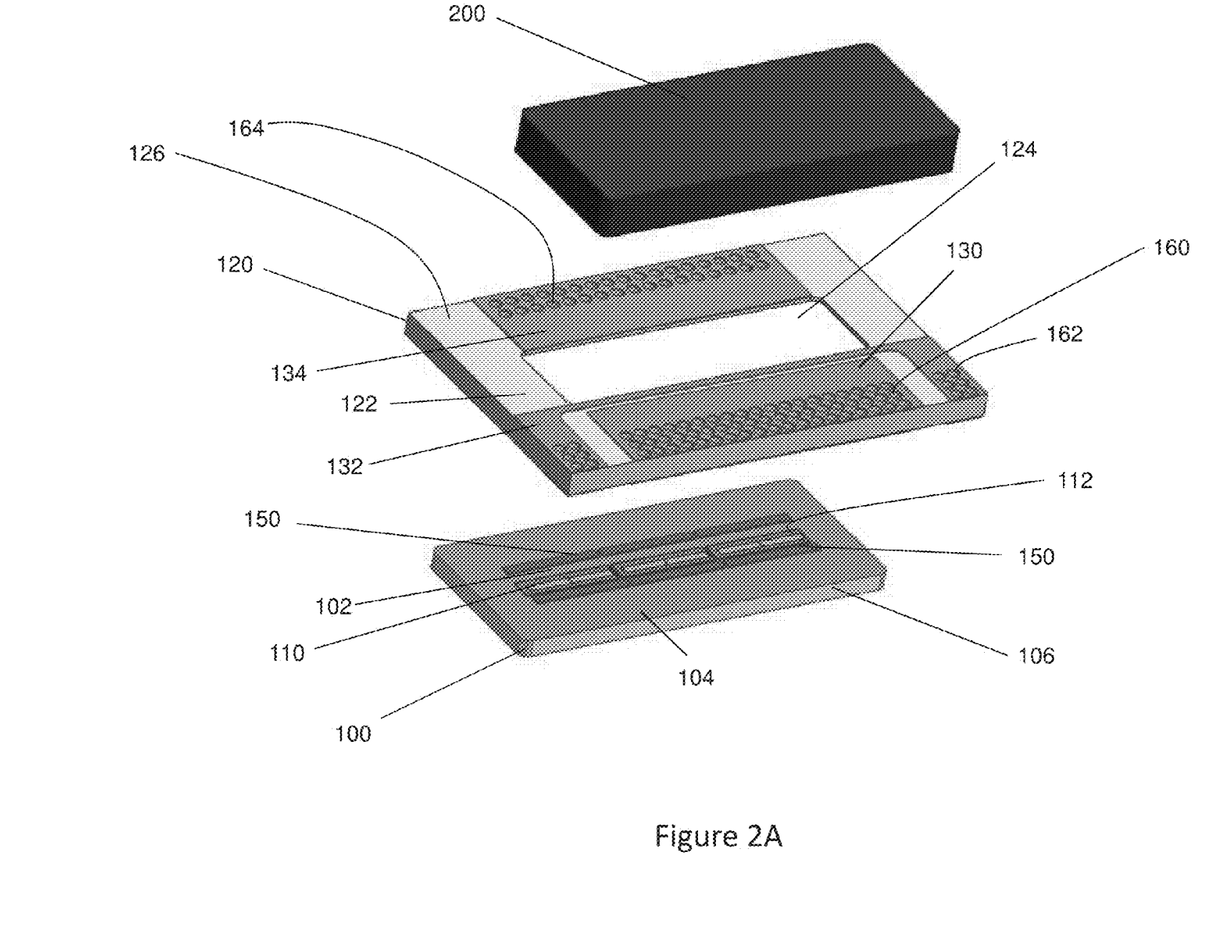
FIGS. 2A and 2B illustrate different exploded views of an embodiment of a PCB-based power semiconductor package having a surface mount configuration.
Figure 2B:
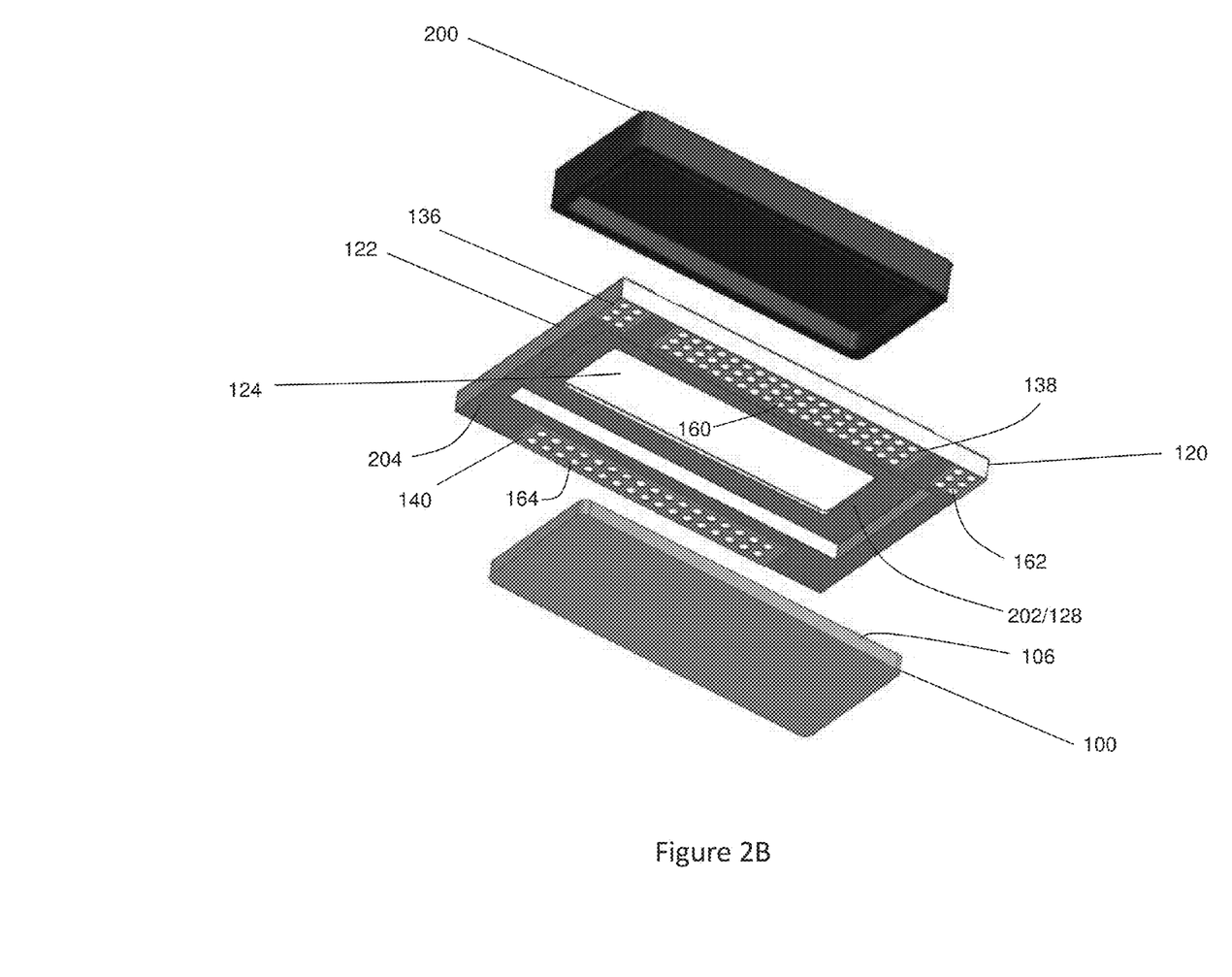

FIG. 2A illustrates a top-down exploded view of the semiconductor package with a surface mount configuration, and FIG. 2B illustrates a bottom-up exploded view of the same package. The embodiment shown in FIGS. 2A and 2B is similar to the embodiment shown in FIGS. 1A and 1B, except the package has a surface mount configuration meaning that the baseplate 100 and the PCB-based window frame 120 can be mounted directly onto the surface of another PCB (not shown in FIGS. 2A and 2B) and the external terminals of the package are at or near the same plane as the bottom side of the baseplate 100. Accordingly, the window frame 120 has a thinner inner part 202 for receiving the baseplate 100 and a thicker outer part 204 which surrounds the baseplate 100 along all lateral sidewalls 106 of the baseplate 100.

Figure 3:
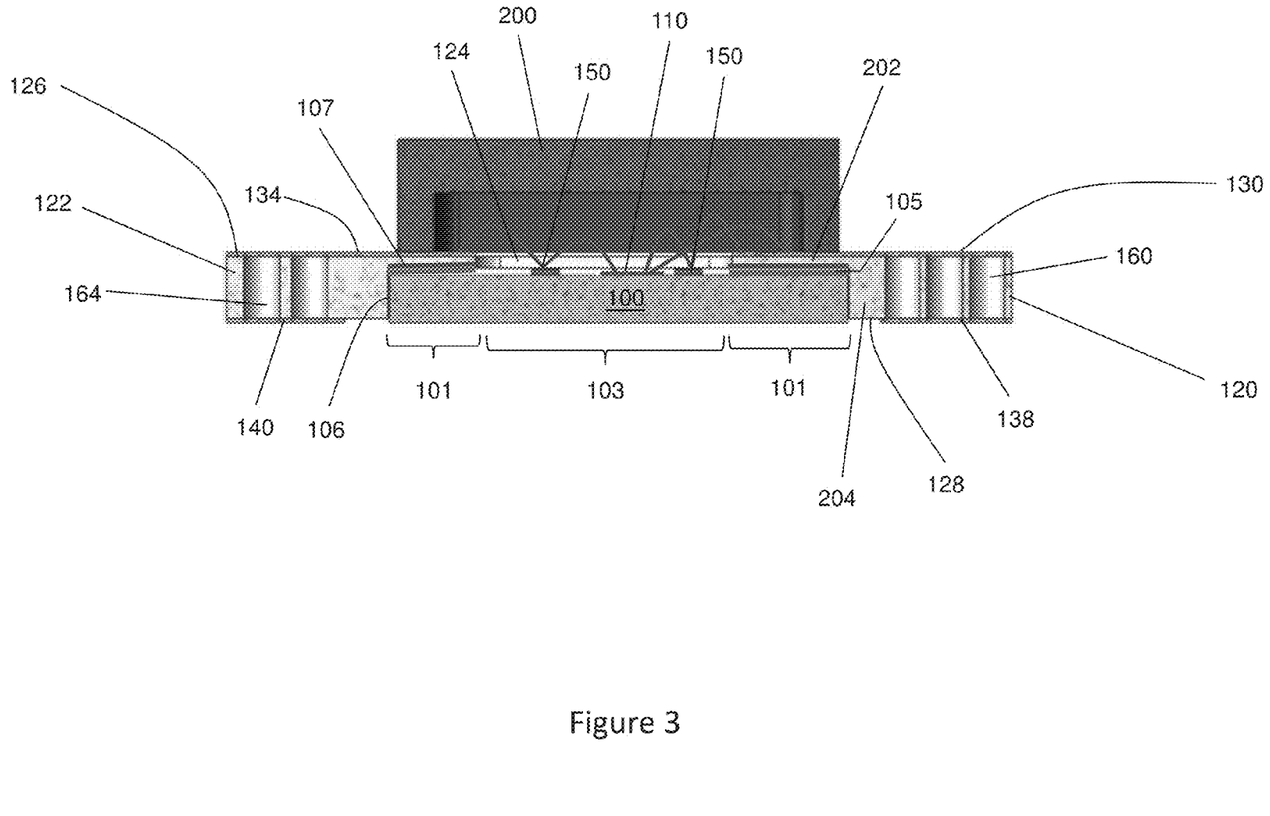
FIG. 3 illustrates a cross-sectional view of an embodiment of a PCB-based power semiconductor package.

FIG. 3 shows a cross-sectional view of the semiconductor package shown in FIGS. 2A and 2B after lid attach. The PCB window frame 120 is attached to the outer peripheral region 101 of the baseplate 100 e.g. using an organic adhesive, soft solder or eutectic window frame attach material 105. In the case of a soft solder or eutectic solder as the window frame attach material 105, an optional copper ring 107 also can be provided on the part of the window frame 120 which attaches to the peripheral region 101 of the baseplate 100 as shown in FIG. 3. The optional copper ring 107 can be used to provide an RF ground for RF applications, and is at the same potential as the baseplate 100 and source side (terminal) of the transistor die 110. The source side (terminal) of the transistor die 110 can be attached to the inner die attach region 103 of the baseplate 100 before the insulative member 122 is attached to the peripheral region 101 of the baseplate. Alternatively, the insulative member 122 is attached to the peripheral region 101 of the baseplate 100 before the source side (terminal) of the transistor die 110 is attached to the inner die attach region 103 of the baseplate 100.

In either case, the insulative member 122 of the PCB-based window frame 120 has an opening 124 for receiving the transistor die 110 and any other components 150 attached to the baseplate 100. The insulative member 122 extends outward beyond the lateral sidewall 106 of the baseplate 100 to provide support for the upper and lower metallizations 130, 132, 134, 136, 138, 140 provided at the opposing sides 126, 128 of the insulative member 122. Again in the case of an electrically insulative member insulative member 122, the metallizations 130, 132, 134, 136, 138, 140 are embedded in or laminated on the electrically insulative member 122. An optional ceramic, LCP or PCB based lid 200 can be attached to the top side of the PCB-based frame 120 as shown in FIG. 3 to form an enclosure for the transistor die 100 and other circuit components 150 attached to the baseplate 100, so that the semiconductor package has an open cavity which is sealed and protects the die 110, other components 150 and electrical connections housed within the enclosure.

The insulative member 122 of the PCB-based window frame 120 illustrated in FIGS. 2A, 2B and 3 has a thinner part 202 attached to the peripheral region 101 of the baseplate 100 and a thicker part 204 abutting and extending outward from the lateral sidewall 106 of the baseplate 100. The upper metallizations 130, 132, 134 extend over both parts 202, 204 of the insulative member 122, and the lower metallizations 136, 138, 140 only extend over the thicker part 204 of the insulative member 122 so that the lower metallizations 136, 138, 140 are spaced apart and electrically isolated from the baseplate 100. According to this embodiment, the package has a surface mount configuration meaning that the baseplate 100 and the PCB-based window frame 120 can be mounted directly onto the surface of another PCB (not shown in FIG. 3) and the external terminals of the package are at or near the same plane as the bottom side of the baseplate 100.

Figure 4:
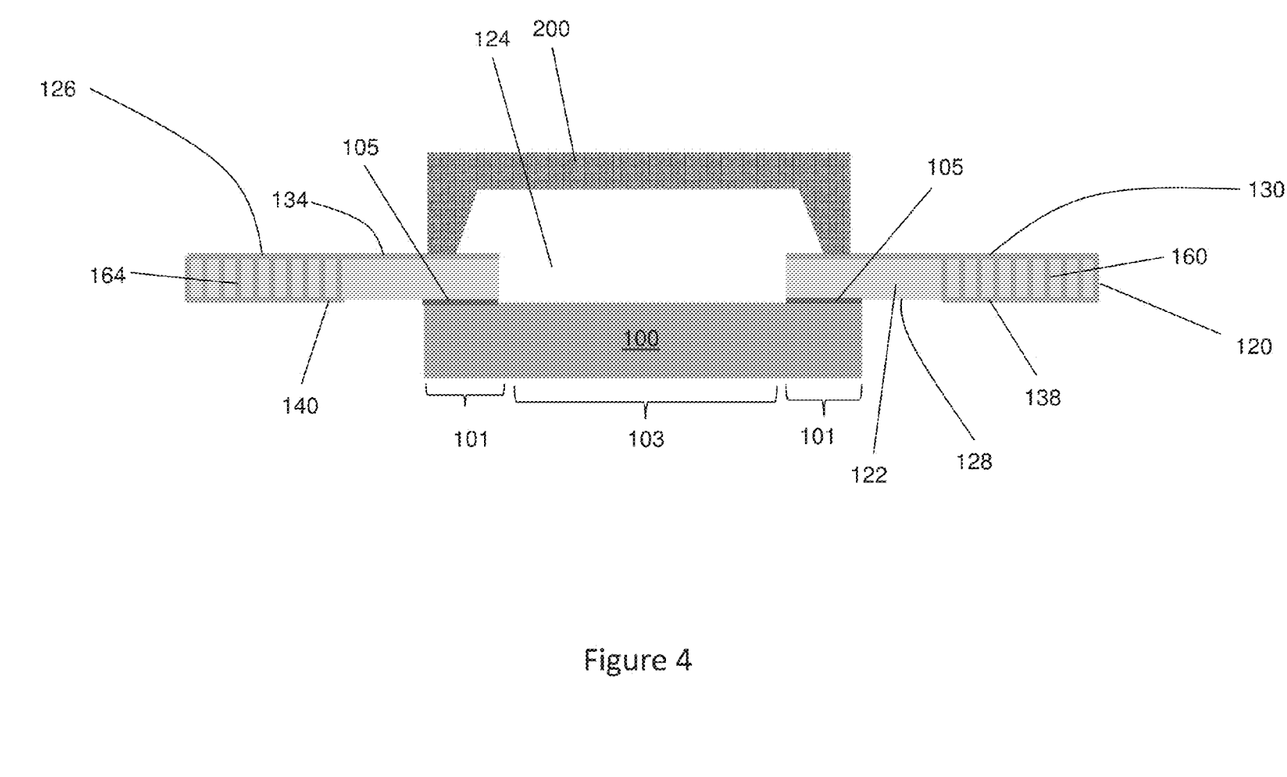
FIG. 4 illustrates a cross-sectional view of another embodiment of a PCB-based power semiconductor package.

FIG. 4 shows a cross-sectional view of the semiconductor package according to another embodiment. The embodiment shown in FIG. 4 is similar to the one shown in FIG. 3, however the insulative member 122 of PCB-based window frame 120 has a relatively uniform thickness over the entire length of the insulative member 122. According to this embodiment, the package has a straight lead configuration i.e. a non-surface mount configuration meaning that the external terminals of the package are at a different plane than the bottom side of the baseplate 100.

Figure 5A:
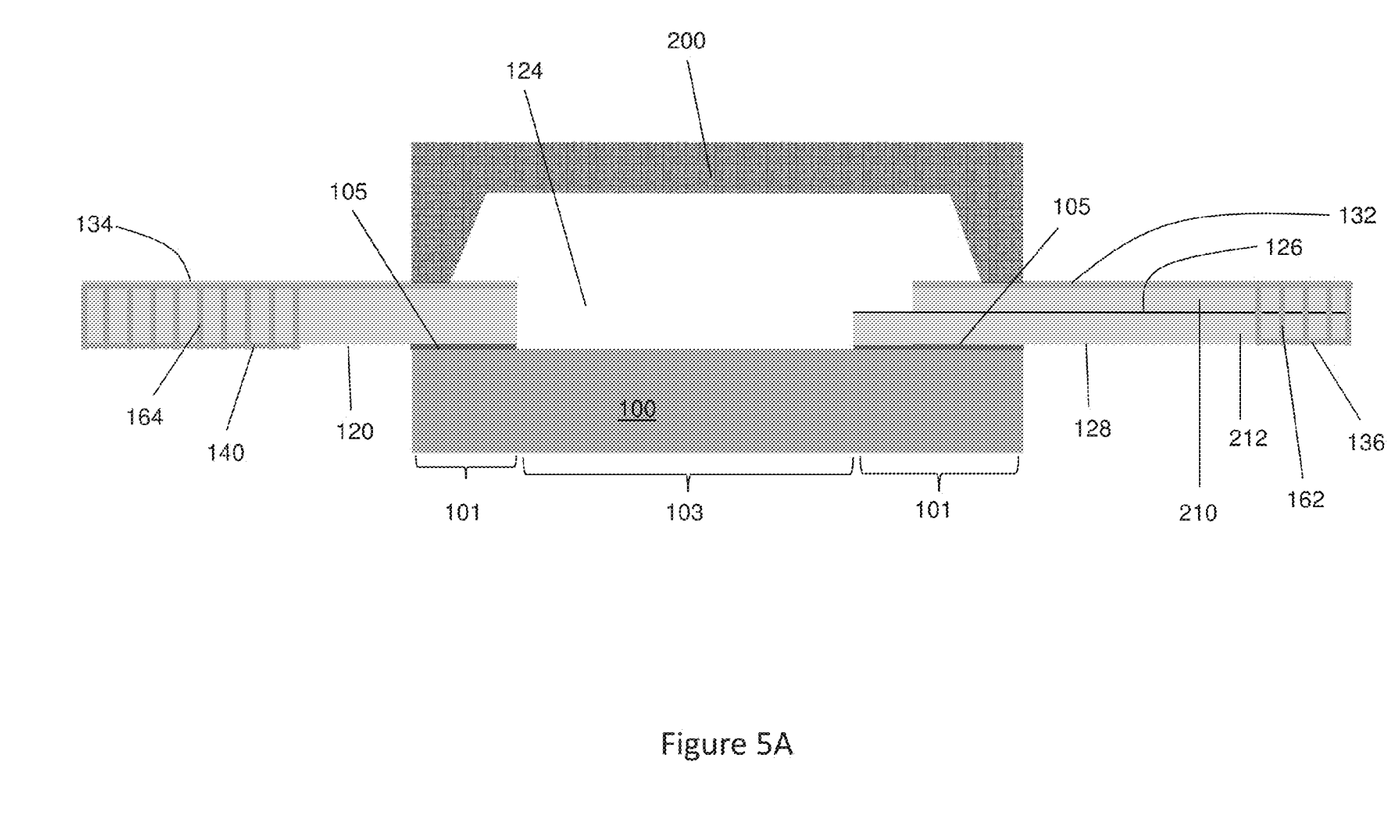
FIGS. 5A and 5B illustrate different cross-sectional views of yet another embodiment of a PCB-based power semiconductor package.
Figure 5B:
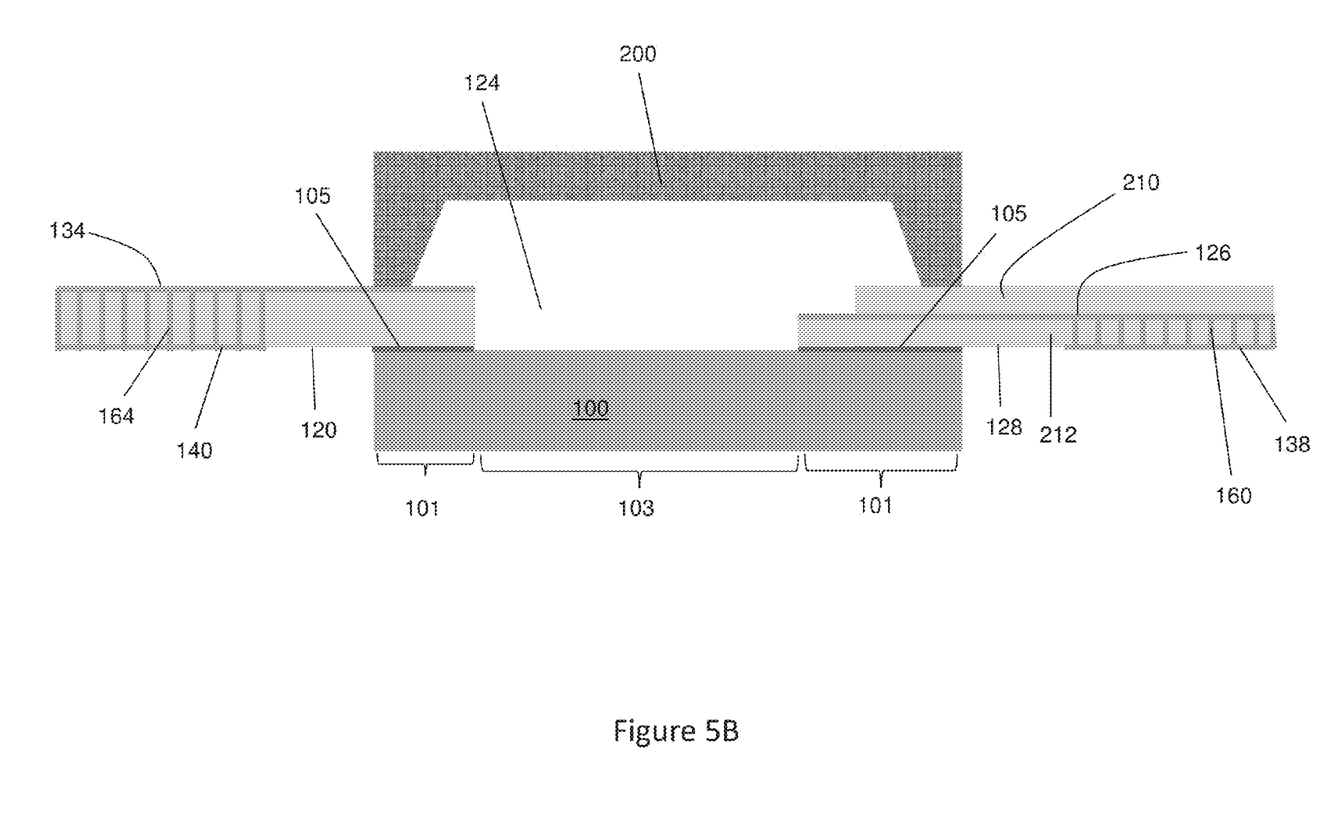

FIGS. 5A and 5B show two different cross-sectional views of the same semiconductor package according to yet another embodiment. The embodiment shown in FIGS. 5A and 5B is similar to the one shown in FIG. 4, however the PCB-based window frame 120 is a multi-level window frame. According to this embodiment, the window frame 120 includes an additional (upper) electrically insulative member 210 such as an electrically insulative member on the first (lower) insulative member 212 at the output side of the package so that the output terminal metallization disposed on the top side 126 of the lower insulative member 212 is interposed between the upper and lower insulative members 210, 212. The DC bus bar metallization 132 is disposed on the (top) side of the upper insulative member 210 facing away from the lower insulative member 212. This way, the electrically conductive vias 160 connecting the output terminal metallization 130 on the top side 126 of the lower insulative member 212 to the corresponding metallization 138 on the bottom side 128 of the lower insulative member 212 only extend through one insulative member 212 as shown in FIG. 5B. In contrast, the electrically conductive vias 162 which connect the DC bus bar metallization 132 on the top side of the upper insulative member 210 to the corresponding metallization 136 on the bottom side 128 of the lower insulative member 212 extend through both insulative members 210, 212 as shown in FIG. 5A. The different sets of electrically conductive vias 160, 162, 164 are electrically insulated from one another. Such a multi-level PCB-based window frame arrangement improves the RF performance of the package by decreasing the wire length of the RF path from the transistor drain.

For example, an asymmetric Doherty amplifier can have a main amplifier in the center part of the baseplate 110 and a first peaking amplifier on one side of the main amplifier and a second peaking amplifier on the other side of the main amplifier. The upper layer 210 of the window frame 120 can be used to bond the DC supply wire and the lower layer 212 of the window frame 120 can be used to bond the drain output wires, thus minimizing the drain output wire length as explained above. Reducing the drain output wire length yields improved RF performance. Moreover in general, the RF signal is conducted through copper traces on the PCB-based window frame 120 which have significantly better conductivity e.g. as compared to Ni, Ni/Pd/Au where Pd and Au are so thin that most of the RF occurs in the Ni layer, or Ni/Au plating. Additional stacked insulative members and corresponding metallizations can be provided as part of the PCB-based window frame 120 if desired.

Figure 6:
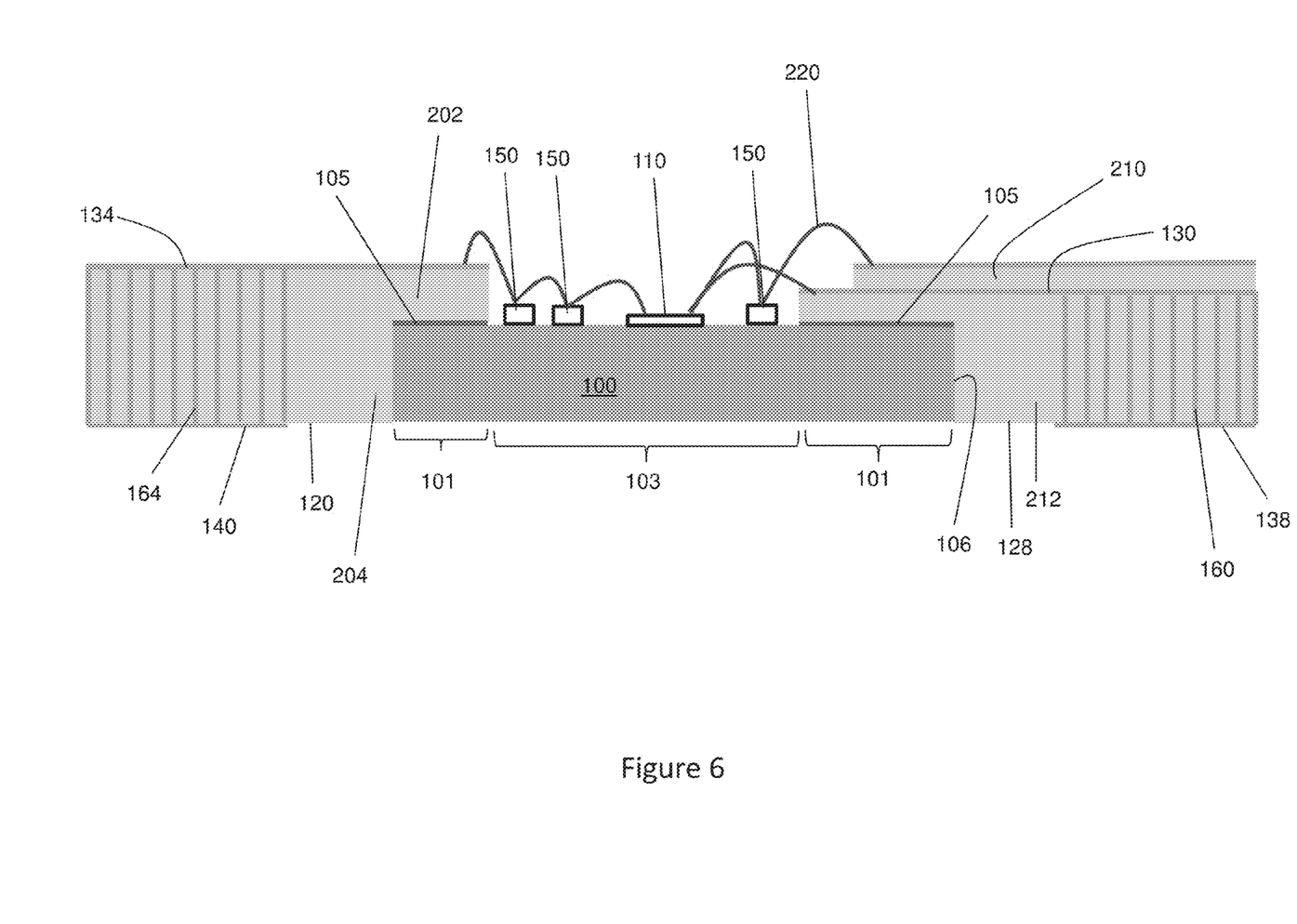
FIG. 6 illustrates a cross-sectional view of still another embodiment of a PCB-based power semiconductor package.

FIG. 6 shows a cross-sectional view of the semiconductor package according to still another embodiment. The embodiment shown in FIG. 6 is similar to the one shown in FIGS. 5A and 5B, however the multi-level PCB-based window frame 120 is surface mount compliant in that the multi-level window frame 120 has a thinner part 202 attached to the peripheral region 101 of the baseplate 100 and a thicker part 204 abutting and extending outward from the lateral sidewall 106 of the baseplate 100. The metallizations 130, 132, 134 on the top side of both insulative members 210, 212 extend over both parts 202, 204 of the window frame 120, and the metallizations 136, 138, 140 on the bottom side 128 of the lower insulative member 210 only extend over the thicker part 204 of the window frame 120 so that these metallizations are spaced apart from and electrically isolated from the baseplate 100.

As with the embodiment shown in FIGS. 5A and 5B, the DC bus bar metallization 132 is disposed on the top side of the upper insulative member 210 facing away from the lower insulative member 212. This way, the electrically conductive vias 160 connecting the output terminal metallization 130 on the top side 126 of the lower insulative member 212 to the corresponding metallization 138 on the bottom side 128 of the lower insulative member 212 only extend through one insulative member 212. In contrast, the electrically conductive vias 162 which connect the DC bus bar metallization 132 on the top side of the upper insulative member 210 to the corresponding metallization 136 on the bottom side 128 of the lower insulative member 210 extend through both insulative members 210, 212. The bottom DC metallization and corresponding conductive vias are out of view in FIG. 6, but may have a similar configuration as shown in FIG. 5A for example. The different sets of electrically conductive vias are electrically insulated from one another. FIG. 6 also shows various bond wire connections 220 between the input, output and DC metallizations 134, 130, 132 to corresponding capacitors and/or IPDs 150 and RF power transistor die 110 attached to the inner region 103 of the baseplate 100. Once again, additional stacked insulative members and corresponding metallizations can be provided if more than a 2-level insulative window frame is desired.

Figure 7:
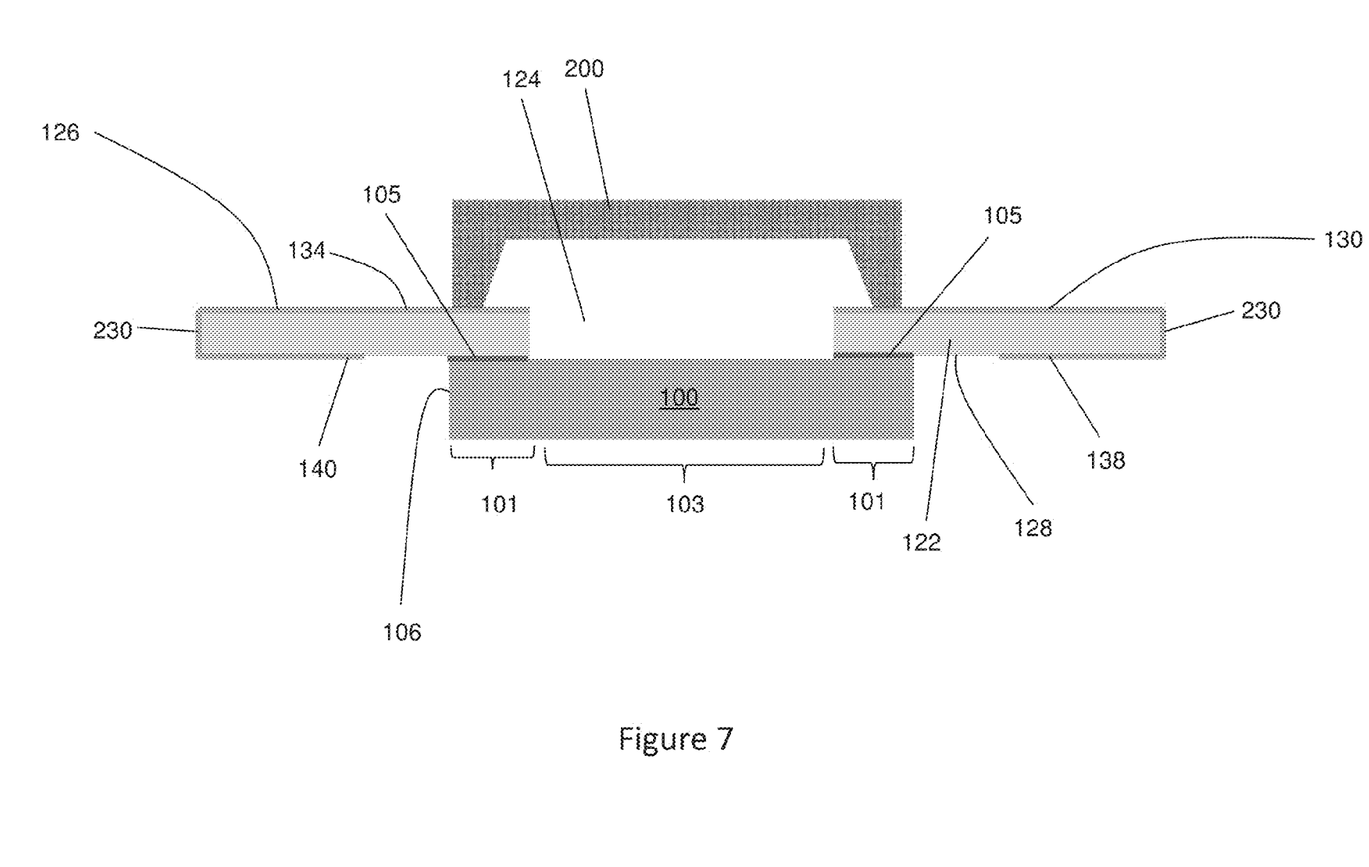
FIG. 7 illustrates a cross-sectional view of another embodiment of a PCB-based power semiconductor package.

FIG. 7 shows a cross-sectional view of the semiconductor package according to another embodiment. The embodiment shown in FIG. 7 is similar to the one shown in FIG. 4, however the insulative member 122 has a metallized lateral sidewall 230 at the input and output sides of the package which is spaced apart from the lateral sidewall 106 of the baseplate 100. This way, the respective metallizations 130, 132, 134, 136, 138, 140 disposed at the top and bottom sides 126, 128 of the insulative member 122 can be electrically connected to each other without using electrically conductive through vias.

Figure 8:
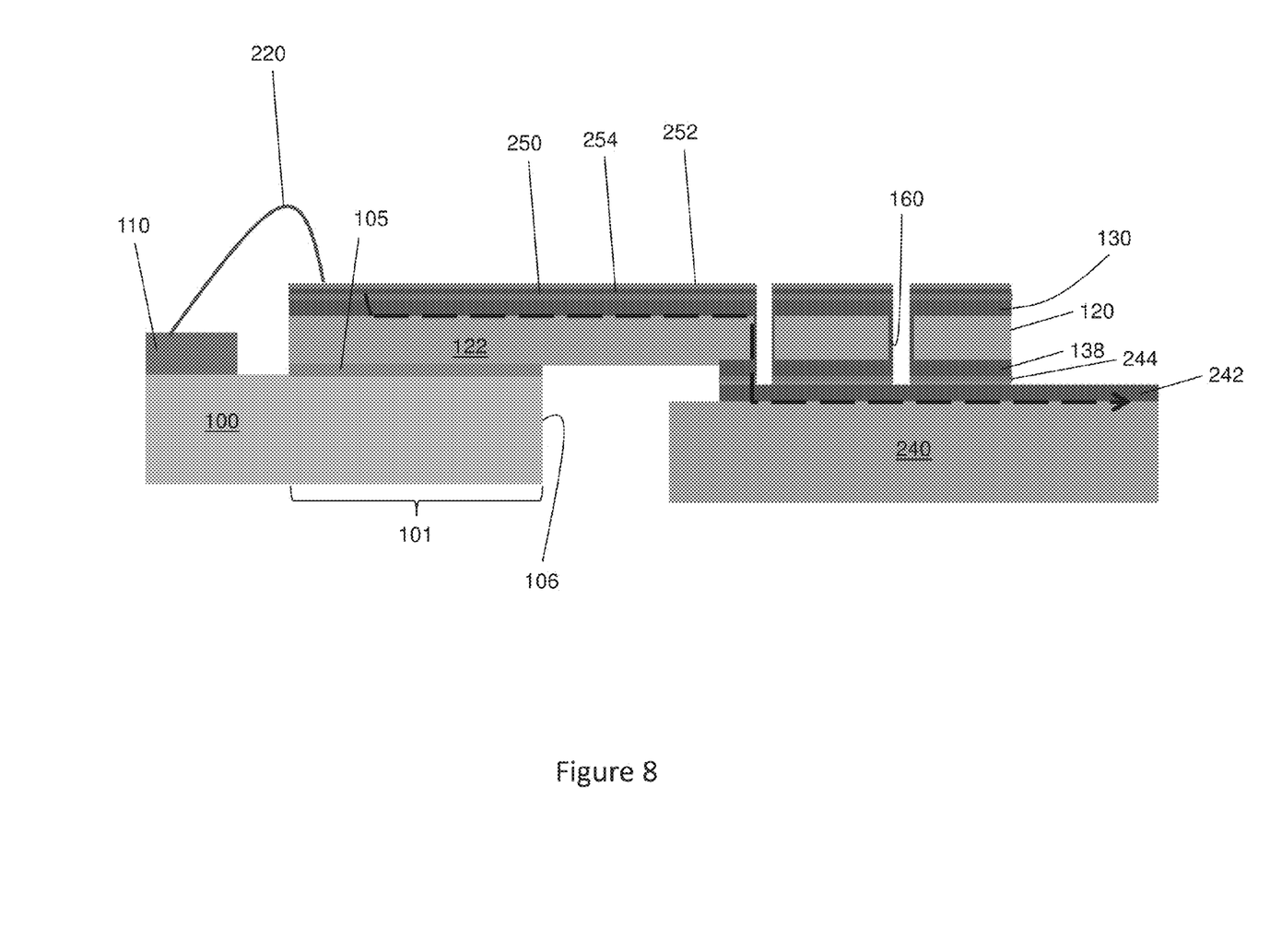
FIG. 8 illustrates a partial cross-sectional view of an embodiment of a PCB-based power semiconductor package with the RF signal path highlighted.

FIG. 8 shows a partial cross-sectional view of the semiconductor package according to an RF-optimized embodiment. FIG. 8 shows part of an RF power transistor die 110 attached source (emitter) side down to the baseplate 100. The inner edge of the window frame 120 is glued to the peripheral region 101 of the baseplate 100 using an organic adhesive 105, and has top and bottom metallizations 130, 138 as described previously herein. Alternatively, solder can be used to attach the inner edge of the window frame 120 to the peripheral region 101 of the baseplate 100 as previously described herein e.g. with reference to FIG. 3. One of the top metallizations 130 is shown wire bonded to the drain (collector) of the power transistor die 110. The outer edge of the window frame 120 is attached to a metallized side 242 of another PCB 240 e.g. using solder 244. The RF signal path through the window frame 120 and the other PCB 240 is highlighted by a dashed line.

A layer of Ni 250 is formed on the top side metallization 130 of the window frame 120, and a layer of Au 252 is formed on the Ni 250. An optional Pd layer 254 may be provided between the Ni and Au layers 250, 252. RF energy prefers to be as close to the ground as possible. In the case of the PCB-based window frame 120 shown in FIG. 8, the RF energy travels through cladded Cu metallization 130, 138 and not through the Ni/Au 250, 252 or Ni/Pd/Au layer 250, 254, 252 plated on the surface of the metallization 130. For example, the skin depth of Cu at 1.88 Ghz is 1.5 microns. Therefore, 5 skin depths is 7.5 microns and about 99% of the RF energy is transmitted through 7.5 microns. A 7.5 micron Cu clad window frame top side metallization 130 has an effective surface electrical conductivity of about 89.07 Siemens-squares. FIG. 8 does not show a Ni/Au plating inside the electrically conductive through vias 160. The RF path should also extensively be through the Cu layer of the vias 160 if such a plating is provided in the vias.

Figure 9:
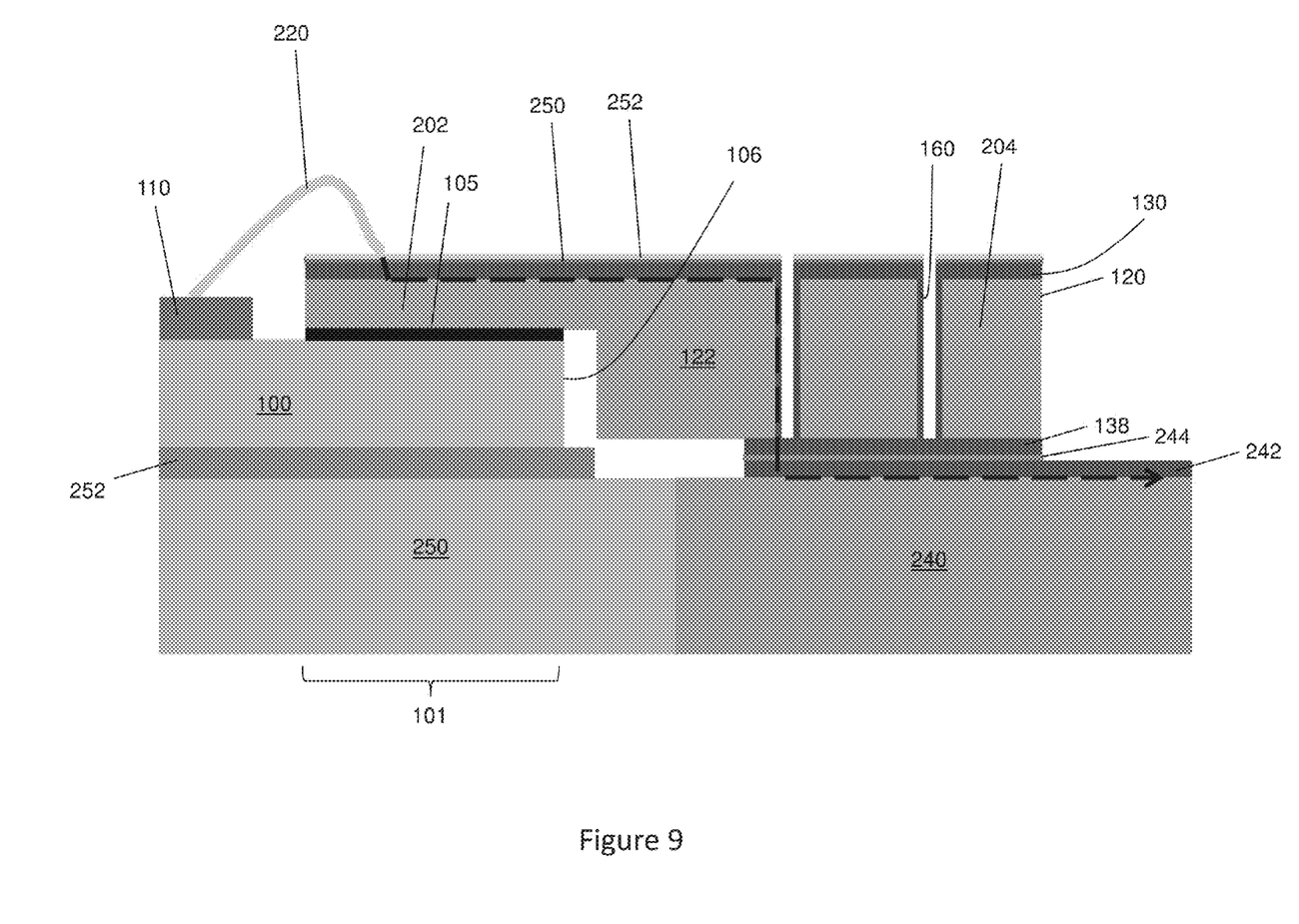
FIG. 9 illustrates a partial cross-sectional view of another embodiment of a PCB-based power semiconductor package with the RF signal path highlighted.

FIG. 9 shows a partial cross-sectional view of the semiconductor package according to another embodiment. The embodiment shown in FIG. 9 is similar to the one shown in FIG. 8, however the package is configured for a surface mount configuration instead of a straight lead configuration. According to this embodiment, the insulative member 122 of PCB-based window frame 120 has a thinner part 202 attached to the peripheral region 101 of the baseplate 100 and a thicker part 204 abutting the lateral sidewall 106 of the baseplate 100. This way, the top side metallizations 130, 132, 134 extend over both parts 202, 204 of the window frame 120 and the bottom side metallizations 136, 138, 140 only extend over the thicker part 204 of the window frame 120 so that the bottom side metallizations 136, 138, 140 are spaced apart and electrically isolated from the baseplate 100. The baseplate 100 is attached via solder 252 to a heat sink 250 included in the other PCB 240 to which the outer edge of the PCB-based window frame 120 is attached as described above with reference to FIG. 8. Again, the RF path out from the drain of the power transistor 110 comprises highly conductive copper i.e. the top side and bottom side metallizations 130, 138 and the corresponding electrically conductive through vias 160 can be made from a copper-containing material to improve RF performance.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
    a baseplate having a die attach region and a peripheral region;
    a transistor die having a first terminal and a second terminal facing away from the baseplate; and
    a frame comprising an electrically insulative member having a first side attached to the peripheral region of the baseplate, a second side facing away from the baseplate, a first metallization at the first side of the insulative member and a second metallization at the second side of the insulative member,
    wherein the insulative member extends outward beyond a lateral sidewall of the baseplate, the first metallization is attached to the part of the first side which extends outward beyond the lateral sidewall of the baseplate, and the first and second metallizations are electrically connected at a region of the insulative member spaced apart from the lateral sidewall of the baseplate.

2. A semiconductor package according to claim 1, wherein the insulative member comprises a thinner part attached to the peripheral region of the baseplate and a thicker part abutting the lateral sidewall of the baseplate so that the package has a surface mount configuration.

3. A semiconductor package according to claim 1, wherein the first and second metallizations are embedded in or laminated to the electrically insulative member.

4. A semiconductor package according to claim 1, wherein the insulative member comprises electrically conductive vias extending between the first and second sides of the insulative member, the conductive vias electrically connecting the first and second metallizations at a region of the insulative member spaced apart from the lateral sidewall of the baseplate.

5. A semiconductor package according to claim 4, wherein the vias comprise openings extending through the insulative member and having sidewalls covered by a copper-containing material.

6. A semiconductor package according to claim 1, wherein the insulative member has a lateral sidewall spaced apart from the lateral sidewall of the baseplate, and wherein the first and second metallizations are electrically connected by a metallization disposed on the lateral sidewall of the insulative member.

7. A semiconductor package according to claim 1, wherein the frame further comprises:
    a third metallization at the second side of the insulative member and spaced apart from the second metallization; and
    a fourth metallization at the first side of the insulative member and spaced apart from the first metallization,
    wherein the third and fourth metallizations are electrically connected at the region of the insulative member spaced apart from the lateral sidewall of the baseplate, the third metallization electrically connects the second terminal of the transistor die to DC, and the second metallization forms an output terminal of the package which is electrically connected to the first terminal of the transistor die.

8. A semiconductor package according to claim 7, wherein the frame further comprises:
    a fifth metallization at the second side of the insulative member and spaced apart from the second and third metallizations; and
    a sixth metallization at the first side of the insulative member and spaced apart from the first and fourth metallizations,
    wherein the fifth and sixth metallizations are electrically connected at the region of the insulative member spaced apart from the lateral sidewall of the baseplate, and the fifth metallization forms an input terminal of the package which is electrically connected to the second terminal of the transistor die.

9. A semiconductor package according to claim 1, wherein the frame further comprises:
    an additional electrically insulative member on the second metallization;
    a third metallization at a side of the additional insulative member facing away from the second metallization;
    a fourth metallization at the first side of the insulative member and spaced apart from the first metallization,
    wherein the third and fourth metallizations are electrically connected at the region of the insulative member spaced apart from the lateral sidewall of the baseplate, the third metallization electrically connects the first terminal of the transistor die to DC, and the second metallization forms an output terminal of the package which is electrically connected to the first terminal of the transistor die.

10. A semiconductor package according to claim 9, wherein the frame further comprises:
    a fifth metallization at the second side of the insulative member and spaced apart from the second metallization; and
    a sixth metallization at the first side of the insulative member and spaced apart from the first and fourth metallizations,
    wherein the fifth and sixth metallizations are electrically connected at the region of the insulative member spaced apart from the lateral sidewall of the baseplate, and the fifth metallization forms an input terminal of the package which is electrically connected to the second terminal of the transistor die.

11. A semiconductor package according to claim 9, wherein the frame further comprises:
    a first set of electrically conductive vias extending between the first and second sides of the insulative member and electrically connecting the first and second metallizations at a region of the insulative member spaced apart from the lateral sidewall of the baseplate; and a second set of electrically conductive vias extending through both insulative members and electrically connecting the third and fourth metallizations at a region of the insulative members spaced apart from the lateral sidewall of the baseplate, wherein the first and second sets of electrically conductive vias are electrically insulated from one another.

12. A semiconductor package according to claim 1, further comprising a lid attached to the second side of the frame to form an enclosure for the transistor die so that the semiconductor package is an open-cavity package.

13. A semiconductor package, comprising:
an electrically conductive baseplate having an inner region and a peripheral region;
a transistor die having a first terminal and a second terminal facing away from the baseplate;
an electrically insulative member having a thinner region attached to the peripheral region of the baseplate, a thicker region extending outward beyond a lateral sidewall of the baseplate so that the insulative member overhangs the baseplate, and an opening in the thinner region which receives the transistor die;
a first metallization at a first side of the insulative member facing away from the base plate and electrically connected to the first terminal of the transistor die;
a second metallization at the first side of the insulative member and spaced apart from the first metallization, the second metallization electrically connected to the second terminal of the transistor die; and
a third metallization attached to the thicker region of the insulative member at a second opposing side of the insulative member and electrically connected to the first metallization at a region of the insulative member spaced apart from the lateral sidewall of the baseplate.

14. A semiconductor package according to claim 13, wherein the insulative member comprises electrically conductive vias extending between the first and second sides of the insulative member, the conductive vias electrically connecting the first and third metallizations at a region of the insulative member spaced apart from the lateral sidewall of the baseplate.

15. A semiconductor package according to claim 14, wherein the vias comprise openings extending through the insulative member and having sidewalls covered by a copper-containing material.

16. A semiconductor package according to claim 13, further comprising an additional electrically insulative member on the first metallization and a fourth metallization at a side of the additional insulative member facing away from the first metallization, and wherein the fourth metallization electrically connects the first terminal of the transistor die to DC and the first metallization forms an output terminal of the package.

17. A semiconductor package according to claim 16, further comprising:
a fifth metallization at the second side of the insulative member and spaced apart from the third metallization;
a first set of electrically conductive vias extending between the first and second sides of the insulative member and electrically connecting the first and third metallizations at a region of the insulative member spaced apart from the lateral sidewall of the baseplate; and
a second set of electrically conductive vias extending through both insulative members and electrically connecting the fourth and fifth metallizations at a region of the insulative members spaced apart from the lateral sidewall of the baseplate,
wherein the first and second sets of electrically conductive vias are electrically insulated from one another.

18. A semiconductor package according to claim 13, wherein the first, second and third metallizations are embedded in or laminated to the electrically insulative member.

19. A method of manufacturing a semiconductor package, comprising:
providing a baseplate having a die attach region and a peripheral region, and a frame comprising an electrically insulative member having a first side, a second opposing side, a first metallization at the first side and a second metallization at the second side;
attaching a transistor die to the die attach region of the baseplate;
attaching the first side of the insulative member to the peripheral region of the baseplate so that the second side faces away from the baseplate, the insulative member extends outward beyond a lateral sidewall of the baseplate and the first metallization is spaced apart from the lateral sidewall of the baseplate;
electrically connecting a first terminal of the transistor die which faces away from the baseplate to the second metallization; and
electrically connecting the first and second metallizations at a region of the insulative member spaced apart from the lateral sidewall of the baseplate.

20. A method according to claim 19, wherein attaching the first side of the insulative member to the peripheral region of the baseplate comprises attaching a copper-containing layer at the first side of the electrically insulative member to the peripheral region of the baseplate through the solder.

* * * * *